United States Patent
Li et al.

(10) Patent No.: US 9,842,818 B2
(45) Date of Patent: Dec. 12, 2017

(54) VARIABLE BALL HEIGHT ON BALL GRID ARRAY PACKAGES BY SOLDER PASTE TRANSFER

(71) Applicant: Intel Corporation, Santa Clara, CA (US)

(72) Inventors: Eric J. Li, Chandler, AZ (US); Jimin Yao, Chandler, AZ (US); Shawna M. Liff, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/083,089

(22) Filed: Mar. 28, 2016

(65) Prior Publication Data

US 2017/0278816 A1   Sep. 28, 2017

(51) Int. Cl.
*H01L 21/44* (2006.01)
*H01L 21/48* (2006.01)
*H01L 21/50* (2006.01)
*H01L 23/00* (2006.01)

(52) U.S. Cl.
CPC .............. *H01L 24/14* (2013.01); *H01L 24/11* (2013.01); *H01L 2224/11003* (2013.01); *H01L 2224/1403* (2013.01); *H01L 2224/14132* (2013.01); *H01L 2924/0105* (2013.01); *H01L 2924/01029* (2013.01); *H01L 2924/0133* (2013.01); *H01L 2924/01047* (2013.01)

(58) Field of Classification Search
CPC .................................. H01L 24/11; H01L 24/14
USPC ......................................................... 438/124
See application file for complete search history.

(56) References Cited

U.S. PATENT DOCUMENTS

| | | | |
|---|---|---|---|
| 5,244,143 A | 9/1993 | Ference et al. | |
| 6,443,351 B1 | 9/2002 | Huang et al. | |
| 6,689,412 B1* | 2/2004 | Bourrieres | H01L 21/4853 228/180.21 |
| 6,736,308 B1* | 5/2004 | Downes | B23K 3/0638 228/248.1 |
| 8,471,154 B1 | 6/2013 | Yoshida et al. | |
| 2014/0091463 A1 | 4/2014 | Yu et al. | |
| 2015/0108204 A1 | 4/2015 | Zheng et al. | |
| 2015/0241476 A1* | 8/2015 | Dang | H01L 24/11 324/755.07 |

OTHER PUBLICATIONS

International Search Report and Written Opinion for International Patent Application No. PCT/US2017/019129, dated Jun. 7, 2017.

* cited by examiner

*Primary Examiner* — David S Blum
(74) *Attorney, Agent, or Firm* — Green, Howard & Mughal LLP.

(57) ABSTRACT

BGA packages with a spatially varied ball height, molds and techniques to form such packages. A template or mold with cavities may be pre-fabricated to hold solder paste material applied to the mold, for example with a solder paste printing process. The depth and/or diameter of the cavities may be predetermined as a function of spatial position within the mold working surface area. Mold cavity dimensions may be specified corresponding to package position to account for one or more pre-existing or expected spatial variations in the package, such as a package-level warpage measurement. Any number of different ball heights may be provided. The molds may be employed in a standardize process that need not be modified with each change in the mold.

16 Claims, 9 Drawing Sheets

Figure 1A:
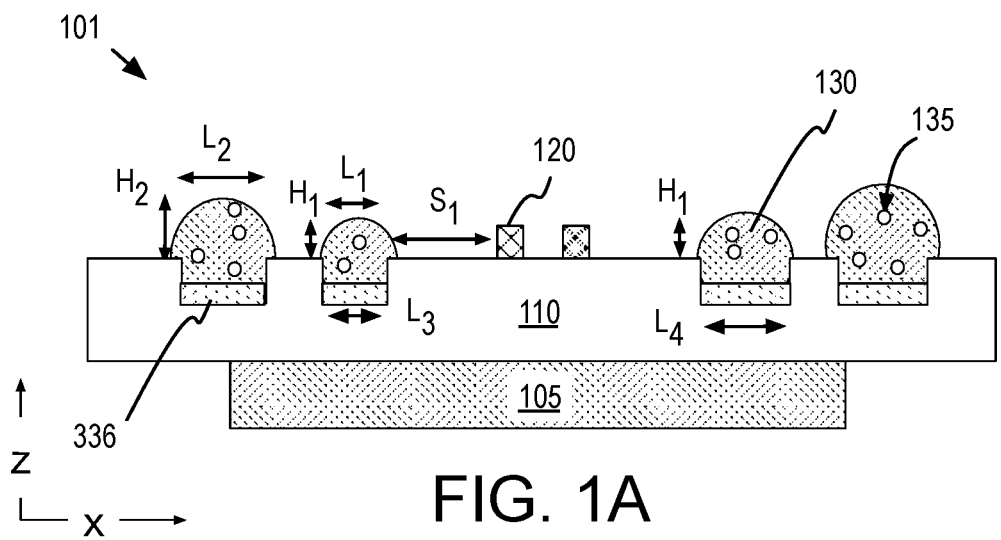

VARIABLE BALL HEIGHT ON BALL GRID ARRAY PACKAGES BY SOLDER PASTE TRANSFER

BACKGROUND

A ball grid array (BGA) package is a type of packaging for integrated circuits (ICs), such as a microprocessor or memory cell array. BGA packages permanently mount to a board or other package with balls of solder that are disposed in a grid layout over the entire surface area of one or more side of the package. While BGA technology is popular for high connection density, high heat conduction, and short, low-inductance connections, a variety of issues limit surface mount yield.

One issue is package warpage in which the package becomes strained and one or more connections are left open. Although a variable ball height (volume) would be able to compensate for package warpage, for example with taller (larger) balls at the package edge and shorter (smaller) balls near the package center, varying the size of the balls within a package is an expensive proposition for the standard ball pick-and-place technology that relies on all balls to be of a same nominal size. A multi-pass process might be employed, for example where smaller balls are placed first followed by larger balls. However, even if only a few different ball sizes were to be used, multi-pass processes would not only be costly, but also marginal with respect to yield as balls placed in a prior pass might be displaced during the subsequent pass.

Another issue is the need to avoid the application of flux or solder paste (which is employed to hold the balls in place during the pick-and-place operation) in regions of the package where land-side components (LSCs) are located. LSCs, such as capacitors, etc. are typically accommodated by providing a pocket in the stencil employed during the flux or paste printing process. The presence of these pockets can limit the minimum spacing between BGA balls and the LSCs and there is a need to scale down this spacing as package form factors continue to shrink.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIG. 1A depicts a cross-sectional view of a BGA package 101 including balls of varying height, in accordance with some embodiments;

FIG. 1B depicts a plan view of a BGA package 102 including balls of varying height, in accordance with some embodiments;

FIG. 2 is a flow diagram of a solder paste molding process for BGA packages, in accordance with some embodiments;

FIG. 3 depicts a cross-sectional view of a solder paste mold, in accordance with some embodiments;

FIG. 4, 5, 6 depict cross-sectional views of loading a solder paste mold, in accordance with some embodiments;

FIG. 7A, 7B depict cross-sectional views of a loaded solder paste mold joined with a package substrate, in accordance with some embodiments;

FIG. 8A, 8B depict cross-sectional views of a transfer of solder paste from a solder paste mold to a package substrate, in accordance with some embodiments;

FIG. 9A, 9B depict cross-sectional views of a loaded package substrate separated from an emptied solder paste mold, in accordance with embodiments;

FIG. 10 depicts a cross-sectional view of a solder paste loaded package substrate prior to final reflow, in accordance with some alternative embodiments;

FIG. 11 depicts a BGA package after final reflow, in accordance with some alternative embodiments;

FIG. 12 illustrates a mobile computing platform and a data server machine employing a BGA packaged microprocessor and/or memory having different solder connection heights, in accordance with embodiments; and FIG. 13 is a functional block diagram of an electronic computing device, in accordance with some embodiments.

DETAILED DESCRIPTION

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or"

as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are packages with a spatially varied ball height, as well as molds and techniques to form such packages. In some embodiments, a template or mold with cavities is pre-fabricated to hold solder paste material applied to the mold, for example with a solder paste printing process. The depth and/or diameter of the cavities may be predetermined as a function of spatial position within the mold working surface area. Mold cavity dimensions may be specified corresponding to spatial position within a package area to account for one or more pre-existing or expected spatial variations in the package, such as a package-level warpage measurement, for example to improve SMT yield. Cavities having a greater depth, resulting in features of greater height, may be positioned within the mold at locations corresponding to where the package is most deflected from an ideal plane. According to embodiments, any number of different ball heights may be provided, and indeed each ball can have a unique height, if desired. In addition, because solder paste is applied to the mold, no flux or paste printing process need be performed directly on the package. The dimensions of exclusion zones associated with land-side components present on the package may therefore be reduced significantly. Embodiments herein also provide advantageously low tooling cost and lead time during process development. In a ball pick-and-place technology, for example, a complete set of tooling must be designed and built for each new test vehicle or product, leading to a high cost and long lead time. Changes during process development may further mandate a second tool set. For embodiments herein, a mold may be readily fabricated at low cost and/or lead-time. The molds are then employed in a standardize solder paste transfer process that need not be modified with each change in the mold.

Figure 1B:
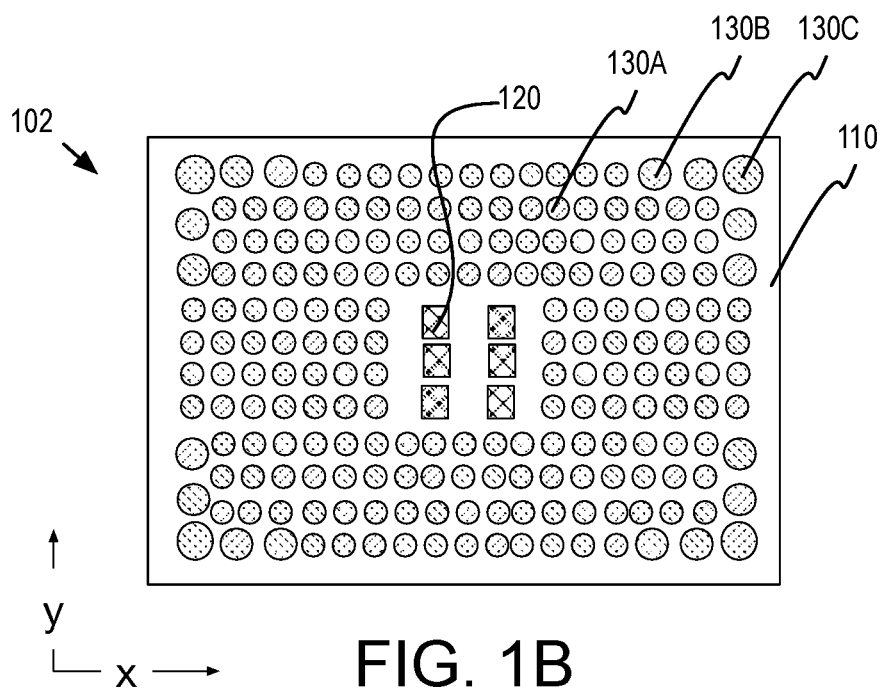

FIG. 1A depicts a cross-sectional view of a BGA package 101 including balls of varying height, in accordance with some embodiments. FIG. 1B depicts a plan view of a BGA package 102 include balls of varying height, in accordance with some embodiments. Referring first to FIG. 1A, an integrated circuit (IC) chip 105 is attached on the chip-side of package 102, for example to a package substrate 110. Package substrate 110 has a land-side, opposite to the chip-side, and further including BGA lands 336 exposed within openings in a solder resist 755. Package substrate 110 may be any substrate known to be suitable for one or more of flip-chip packages (FCBGA), package-on-package (PoP), system-in-package (SiP), embedded wafer-level ball (eWLB), wafer-level chip-scale packaging (WLCSP), or the like. In some embodiments, substrate 110 is compatible with Surface Mount Technology (SMT). In some embodiments, substrate 110 comprises a laminate of electrical routing metallization embedded within dielectric build-up layers. In some alternative embodiments, substrate 110 comprises a plastic or ceramic. IC chip 105 may include one or more IC, such as, but not limited to, a microprocessor, a memory, a System-on-Chip (SoC), a Radio Frequency IC (RFIC), a floating point gate array (FPGA), or a power management IC (PMIC). BGA lands 336 may comprise a surface of any conductive material that is wettable by solder. In some embodiments, BGA lands 336 include a surface finish, such as NiPdAu or Copper Organic Solderability Preservative (Cu OSP), that is solder-wettable. Solder resist 755 may be any material known to be suitable for confining solder. Solder resist 755 may be any material that is non-wettable by solder. In some embodiments, solder resist 755 comprises a polymer. In some embodiments, the polymer is an epoxy resin, such as, but not limited to an acrylate of novolac.

As further illustrated in FIG. 1A, BGA package 101 includes a plurality of solder features 130 disposed over the BGA land-side. In some advantageous embodiments, the solder features 130 are solder spheres having a spherical form indicative of a free-surface solder reflow. Solder features 130 may be of any solder composition known to be suitable for BGA packages. In some embodiments, solder features 130 comprise a metal. In some exemplary embodiments, solder features 130 are of a Sn—Ag—Cu (SAC) alloy, such as, but not limited to SAC 305 or SAC 405.

In some embodiments, solder features 130 include a first solder feature having a first feature height $H_1$, and a second solder feature having a second feature height $H_2$, that is significantly different than the height $H_1$ (e.g., more than 10% different). In some advantageous embodiments, feature height $H_2$ exceeds height $H_1$ by more than 10% of $H_1$. For example, in some embodiments where $H_1$ is approximately 240 μm, $H_2$ is more than 260 μm. In some further embodiments, the height $H_2$ exceeds height $H_1$ by more than 25% of $H_1$. For example, in some embodiments where $H_1$ is approximately 240 μm, $H_2$ is at least 300 μm. While solder features fabricated from solder balls that were picked-and-placed onto a package substrate may be expected to have some height variation, manufacturing tolerances are such that solder ball diameter variation can be controlled to well below 10% and indeed pick-and-place operations typically cannot accommodate solder ball variation greater than 10% without incurring significant process marginality and a concomitant yield reduction. Variations in solder feature height greater than 10% are therefore indicative of a BGA technique other than a single-pass pick-and-place.

In some embodiments, a plurality of solder features on a package substrate is associated with a plurality of sets of solder feature heights, the sets each having a different nominal height. For example, a first subset of the solder features may be associated with a nominal first height, such as $H_1$, while a second subset of the solder features may be associated with a nominal second height, such as $H_2$. Each of the solder feature subsets can be expected to have some distribution of heights about their target, for example $H_1+/-\sigma_1$ and $H_2+/-\sigma_2$ with the two populations being statistically different from each other. In some further embodiments, there are more than two nominal solder feature heights. Any number of different nominal solder feature heights are possible, ranging from a minimum of two heights to as many heights as there are solder features.

In some embodiments, solder feature heights vary spatially over a package substrate area in a non-random manner. Whereas solder feature height variation resulting solely from process variation will tend to be independent of location across an area of the package substrate, the solder feature height in accordance with some embodiments may vary according to a predetermined spatial distribution function. In some embodiments, solder features of a greater feature height are disposed more near (proximal) a perimeter edge of the package than those of lesser height. For example, as illustrated in FIG. 1A, solder feature 130 having a height $H_2$ are disposed nearest the perimeter edge, while solder feature 130 having height $H_1$ are disposed nearest (by a lateral distance $S_1$) land-side components 120 disposed at a center of package substrate 110.

In further embodiments where there are more than two solder feature heights, the heights may increase monotonically as a function of increasing distance from a center of the package substrate. For example, the plan view of FIG. 1B further illustrates a BGA package 102 with a spatial arrangement of solder features suitable for accommodating package warpage where corners of package substrate 110 deflect away from a plane of constant height (e.g., z-dimension). In FIG. 1B, the solder features 130A, 130B and 130C are associated with three different solder feature heights. Solder feature 130B disposed more proximal a perimeter edge of the substrate than solder feature 130A has a second feature height that is at least 10% greater than that of solder feature 130A. Third solder feature 130C disposed more proximal a perimeter edge of the substrate than solder feature 130B has a third feature height that is at least 10% greater than that of solder feature 130B. In the example shown, land-side components 120 are disposed within an interior region of package substrate 110, surrounded by a perimeter of solder features 130A, for example having a minimum nominal height. Solder features 130A are further surround by a perimeter of solder features 130B and/or 130C, having a greater nominal height. Such a monotonically increasing solder feature height may be advantageous where package warpage results in perimeter portions of package substrate 110 deflecting more from a reference z-height plane than do central portions of package substrate 110. Of course, solder feature height may be varied spatially to account for other than package substrate warpage, for example to account for predetermine non-planarity associated with a board to which the package substrate is to be mounted.

Solder feature diameter, as well as feature pitch, may vary as a matter of package design, and may further adhere to a spatial grid array of BGA lands on package substrate 110. The grid pitch of the solder features 130 may vary. Exemplary grid pitches to accommodate a given BGA land array pitch include: approximately 600 μm (e.g., 635 μm), approximately 500 μm, approximately 400 μm (e.g., 406 μm), approximately 300 μm (e.g., 305 μm), and approximately 150 μm. Lateral solder feature width $L_1$ and $L_2$ may be a function of the pitch of lands 336, which may, for example, have a lateral width that is approximately 60% of the land pitch (e.g., 381 μm for a 635 μm pitch, or 203 μm for a 305 μm pitch). In some further embodiments, solder feature height varies independently of solder resist opening diameter. For example, solder features 130 may be disposed within openings in solder resist 775 that have one or more diameter $L_3$, and/or $L_4$, which may also be a function of the pitch and/or the lateral width of lands 336. A difference between solder feature height $H_1$ or $H_2$ may be independent of resist opening diameters $L_3$ and $L_4$. For example, a solder feature with greater height may be disposed within a solder opening of smaller diameter.

In some embodiments, solder features 130 have voids 135 of at least 5% of solder area. Voids 135 may be present at the interface of lands 336, or may be located in the bulk of solder features 130. In some embodiments, solder features 130 have voids 135 of at least 5% of solder area within the solder bulk with void area potentially being even higher at the interface with lands 336. In some embodiments, solder features 130 have voids 135 of at least 15% solder area. The existence of voids 135, particularly those within the solder feature bulk, is indicative of a solder paste process. Voids are generally a result of volatile organic compounds (VOCs) within a solder paste and form as the paste is reflowed into the solder features 130. Voiding area is generally a well-characterized quality control parameter monitored for in paste-based BGA processes. Voiding is not indicative of a solder ball pick-and-place process because solder balls that are picked-and-placed onto a package substrate are typically purely metallic, lacking any significant VOC content. Hence, a voiding area over 5%, and certainly over 15%, is indicative of a solder-paste based BGA process.

Figure 2:
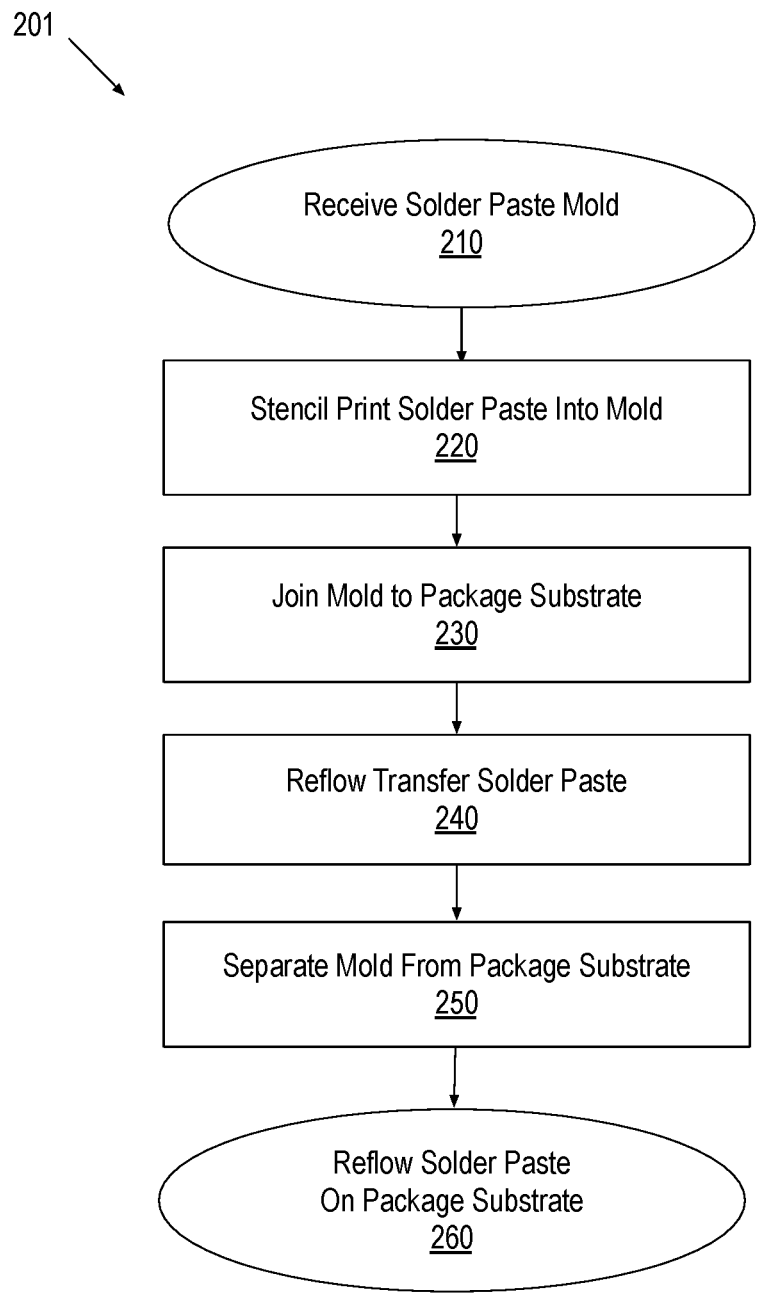

FIG. 2 is a flow diagram of a solder paste molding method for BGA packages, in accordance with some embodiments. Method 201 begins with receiving a solder paste mold at operation 210. The solder paste mold is to function as a template that defines both the spatial location of the solder paste and also the volume of the paste that is to be transferred at a particular spatial location. Spatial location and volume of the solder paste is defined by the location and dimension of cavities or depressions formed in a working surface of the mold. A working surface of the mold is to be machined (e.g., by laser) to include cavities of predetermined, specified volume such that when the cavities are completely filled by an unmetered solder paste stencil printing operation 220, the mold can then be joined to a package substrate at operation 230, and a metered amount of solder transferred to specific locations of the package during reflow operation 240. Hence, the mold cavities are to be positioned relative to lands on the package. The cavities therefore are to spatially map to a predetermined BGA grid array layout. At operation 250, the mold is separated from the package substrate. If desired, the transferred solder paste may then be reflowed again at operation 260 to allow the solder paste features to flow into spherical solder features as a result of free surface energy. Because the amount of paste transferred to the substrate from the mold can be customized for each BGA land location, the final solder feature size (e.g., height) may vary widely across the area of the package substrate, for example allowing for larger features where greatest amount of package warpage occurs.

Figure 3:
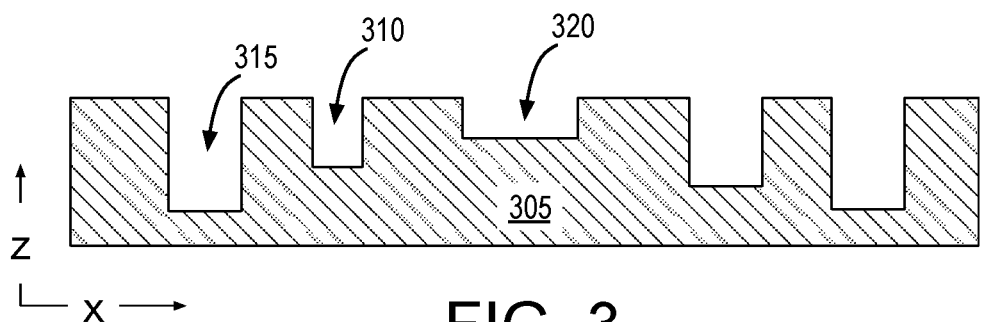
Figure 4:
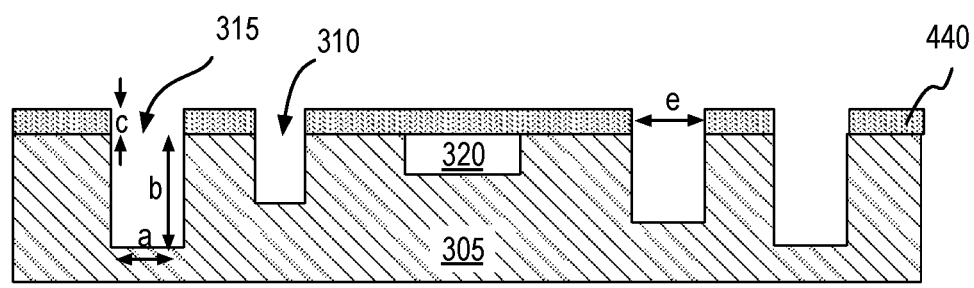

FIG. 3 depicts a cross-sectional view of a solder paste mold 305, in accordance with some embodiments. FIG. 4 depicts a cross-sectional view of solder paste mold 305 after a solder paste printing stencil 440 is applied to the working surface. Solder paste mold 305 may be of a unitary material or a composite that includes a material that is non-wettable by solder. Advantageously, solder paste mold 305 has a coefficient of thermal expansion (CTE) that is well-matched to the effective CTE of the package substrate with which it is to mate. Exemplary unitary materials include liquid crystal polymer (LCP) and graphite. Examples of composite materials include a stainless steel bulk with a suitable coating, such as an organic polymer or graphitic coating, disposed on at least the working surface. For rapid prototyping, mold preform material or 3D printed molds may be utilized. Notably, a single mold may accommodate concurrent, parallel processing of many packages. Hence, only a portion of mold 305 corresponding to a single package is illustrated in FIG. 3. Mold 305 may however be dimensioned to hold many such packages, for example matching some number of packages (e.g., a strip) on a given carrying media.

Solder paste mold 305 has a working surface including a plurality of cavities of a type that is to receive solder paste. In exemplary embodiments, at least one of lateral width or diameter (e.g., x-dimension) and depth (e.g., z-dimension) varies over the plurality of cavities. For the illustrated example, a first cavity 310 has a first lateral width and depth and a second cavity 315 has a second lateral width and depth. At least the depth of cavity 315 is greater than that of the cavity 310 to provide a solder feature with greater height. The actual depth of a mold cavity needed to ensure a predetermined solder feature height may vary as a function of package warpage at a given location. In some exemplary embodiments, the depth of cavity 315 is greater than that of the cavity 310 by at least 10% of the depth of cavity 310. In some advantageous embodiments, the depth of cavity 315 is greater than that of the cavity 310 by at least 25% of the depth of cavity 310. Although the spatial relationship of cavity 310 to 315 may vary, in the illustrated embodiment, the deeper cavity 315 is disposed closer, or more proximal, to a region of the mold corresponding to a BGA position at a perimeter edge of a package substrate to which mold 305 is to mate. The shallower cavity 310 is more proximal to a region of the mold that is to map to a center BGA position of the package substrate. Such a spatial relationship is indicative of a solder feature size-based accommodation to package warpage.

In addition to varying cavity dimensions based on warpage estimates, nominal mold cavity dimensions may be based on other factors, such as, BGA pitch, solder resist opening dimensions, solder resist thickness, stencil thickness, and metallic loading of the solder paste. For example, a solder volume V may be estimated as:

$$V = \frac{4}{3}\pi\left(\frac{d}{2}\right)^3 = \frac{1}{6}\pi d^3, \quad (1)$$

where d is the estimated solder ball diameter. This diameter ball may be provisioned from a solder paste quantity defined by a mold cavity of a diameter a and depth b, for a stencil thickness c, and a metallic loading of the solder paste L, as shown in FIG. 4. For the solder volume V, then:

$$V = \pi\left(\frac{a}{2}\right)^2 (b+c)L = \frac{1}{4}\pi a^2 (b+c)L. \quad (2)$$

In an exemplary embodiment where L=50%, c=0, d=60% of pitch, and a=60% of pitch, conservation of solder volume V leads to an estimated cavity depth b of ~80% of pitch. Such a cavity has an aspect ratio (b:a) of ~1.33:1, which is well within capability of vacuum solder paste printing and may also be achieved by other techniques such as multi-pass paste printing processes. In further embodiments where solder paste extrusion above the mold surface attributable to a non-zero stencil thickness (c>0), the cavity depth (aspect ratio) is even less (e.g., ~1.25:1). Assuming a nominal cavity (e.g., cavity 310 in FIG. 4) has an aspect ratio of 1.25:1, a larger cavity (e.g., cavity 315 in FIG. 4) may have an aspect ratio of 1.3-1.5:1. Or ignoring stencil thickness, an aspect ratio of 1.5-1.7:1.

Mold 305 may be machined with any known technique, such as, but not limited to laser ablation, to form cavities in the working surface. Spatial positioning of cavities that are to receive solder paste may vary as a matter of design, but may generally adhere to a spatial area grid array typical of BGA lands on a package substrate. The grid pitch of the cavities may vary. Exemplary grid pitches to accommodate a given BGA land array pitch include: approximately 600 μm, approximately 500 μm, approximately 400 μm, approximately 300 μm, and approximately 150 μm. Lateral width of the cavities is generally a function of their pitch. Typically, BGA lands have a lateral width that is approximately 60% of the pitch (e.g., 381 μm for a 635 μm pitch, or 203 μm for a 305 μm pitch). In advantageous embodiments, lateral widths of the mold cavities that are to receive solder paste are slightly smaller than a solder resist opening on the package substrate that surrounds the land. Hence, for some embodiments where the grid array of cavities to receive a solder paste has a pitch no more than 400 μm, the lateral width of the mold cavities is no more than 250 μm. For the above exemplary aspect ratios, the depth of the cavities may then be expected to range between approximately 325 μm and approximately 425 μm. Although illustrated with vertical sidewalls, the cavity shape may be optimized for solder paste loading and/or solder paste transfer, for example have a smaller diameter at the bottom than at the top of the cavity.

In some further embodiments, a solder paste mold further comprises one or more cavity or relief of a second type that is to accommodate one or more land-side components on a package substrate. In the exemplary embodiment illustrated in FIG. 3, cavity 320 is an exemplary land side component relief. Rather than being dimensioned to define a predetermined solder paste volume, cavity 320 is dimensioned based on the maximum land-side component height that is to be positioned within cavity 320 when mold 305 is joined into contact with the land side of a package substrate. Lateral dimensions of cavity 320 are associated with a predetermined land-side component exclusion zone (i.e., keep-in zone). Cavity 320 may have a surface that is wettable or non-wettable by solder paste, as no paste is to be applied to cavity 320 in the course of the paste molding process. Dimensions of the exclusion zone are only a function of land-side component placement tolerance (which is typically a constant for all ball attached technologies) and the accuracy and/or precision of the machining of the mold. In contrast, for a standard ball-attach process with land-side components, a printing step is needed to provide flux or paste to the BGA lands before ball placement. Such a printing process requires a finite exclusion zone that is usually on the order of millimeters. In some embodiments described further below, no such printing steps are needed before paste transfer from the mold.

A printing stencil may be applied to the mold using any technique known to be suitable for application to a package substrate. Stencil openings are to be aligned with mold cavities that are to receive solder paste and the stencil is to otherwise block mold cavities that are not to receive solder paste. As further illustrated in FIG. 4, printing stencil 440 fully encloses mold cavity 320, precluding subsequent application of solder paste. Solder paste printing stencil 440 has openings of diameter e aligned with mold cavities 310 and 315. In some embodiments, stencil opening diameter e is smaller than mold cavity diameter a. Notably, stencil 440 is flat (e.g., a metal sheet), having some nominal thickness c. Stencil thickness c may be selected to ensure solder paste extrusion above the mold surface post printing is sufficient to ensure direct contact between solder paste 530 and a package BGA land. The thickness requirement can be determined experimentally for a given application as its contribution to the volume of the solder feature is expected to be minimal. In some exemplary embodiments, stencil thickness c is 2-3 mils (~50-75 μm).

Figure 5:
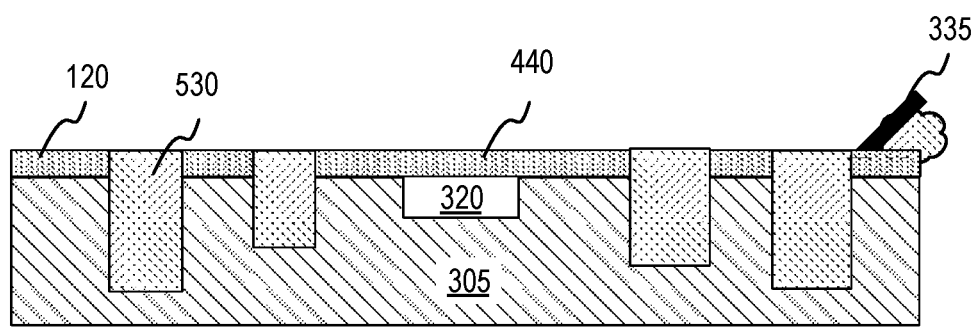
Figure 6:
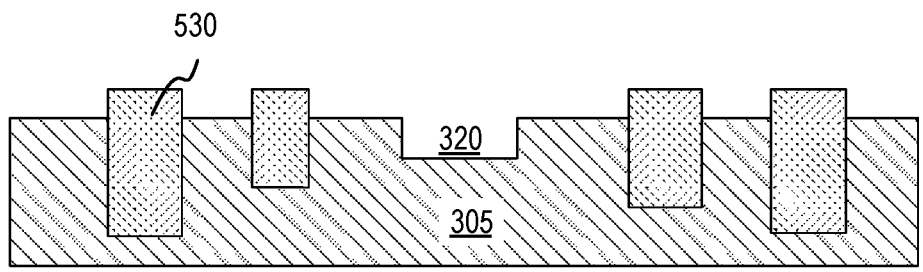

FIG. 5 depicts a cross-sectional view of a solder paste mold 305 that has been loaded with solder paste 530, for example in accordance with some embodiments of operation 220 (FIG. 2). In exemplary embodiments, a conventional solder paste printing process (represented by wiper 335 in FIG. 5) is employed to load or fully backfill the mold cavities level with a top surface of stencil 4400. In alternative embodiments, a vacuum and/or injection-assisted solder paste printing process is employed to load the mold. FIG. 6 depicts a cross-sectional view of a solder paste mold 305 that has been loaded with solder paste 530, following stencil removal, in accordance with some embodiments. As shown, solder paste 530 extends beyond portions of the mold working surface that were protected by the stencil. Solder paste 530 may be any known composition, having any conventional metallic content. In some exemplary embodiments, solder paste 530 is 40-60% metallic with the metallic comprising a SAC alloy, such as, but not limited to SAC 305 or 405.

Figure 7A:
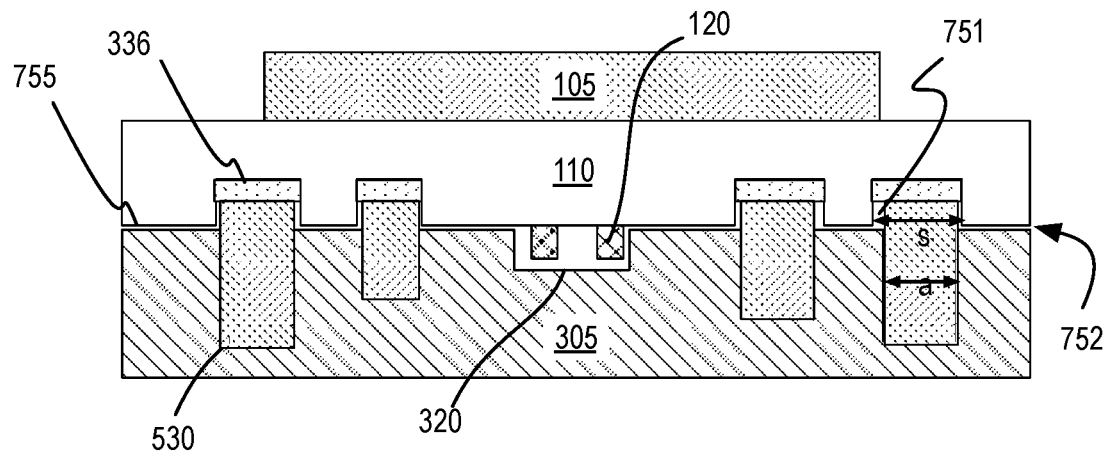
Figure 7B:
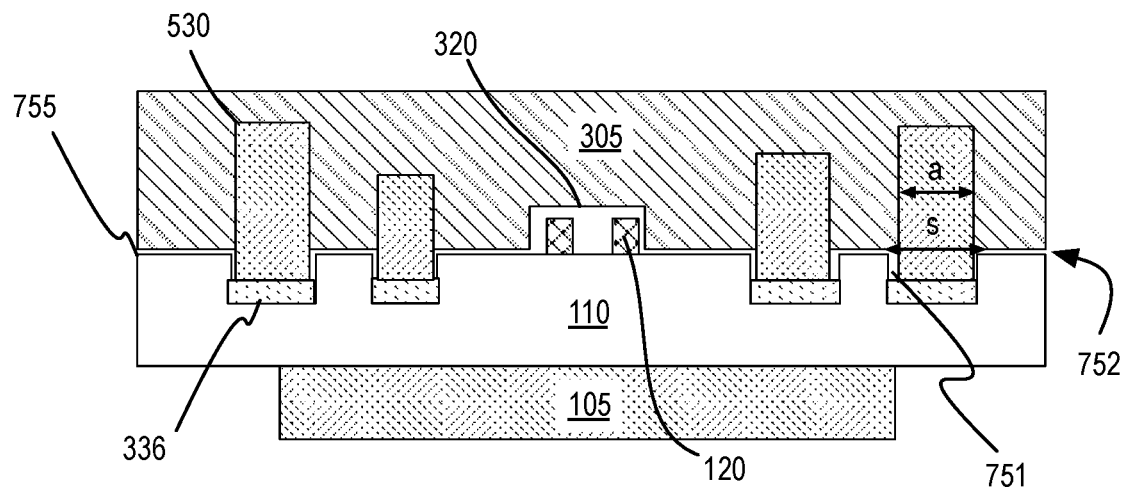

Following stencil removal, the solder paste-loaded mold is joined with a land-side of a package, for example at operation 230 (FIG. 2). To join, the solder paste features are aligned to BGA lands on the package substrate. Either the loaded mold may be placed upon a package, or the package placed upon the loaded mold. FIG. 7A depicts a cross-sectional view of a solder paste-loaded mold 305 joined with a package substrate 110, in accordance with some pick-and-place package embodiments. FIG. 7B depicts a cross-sectional view of a solder paste-loaded mold 305 joined with a package substrate 110, in accordance with some pick-and-place mold embodiments. For either embodiment, solder paste 530 makes direct contact with a BGA land 336. In the exemplary embodiments illustrated, package substrate 110 stands-off mold 305 by a gap space 752 resulting from the solder paste extrusion height associated with the paste printing stencil thickness. The solder paste extrusion height may support the package during subsequent processing steps, for example allowing volatile species to escape through gap space 752 during solder paste reflow. In alternative embodiments, spacers or "stand-offs" (not depicted) may be provided on the mold working surface adjacent to various solder paste features to prevent the package from fully collapsing onto the mold. For such embodiments, suitable pockets are provided in the paste printing stencil to accommodate these stand-offs while maintaining a flat top surface. As further illustrated in FIG. 7A, 7B because the diameter a of solder paste 530 is smaller than diameter s of the solder resist opening, there is a lateral gap 751 between solder resist 755 and solder paste 530. This gap may be non-symmetrical about solder paste 530 as a function of misalignment between package substrate 110 and mold 305.

Figure 8A:
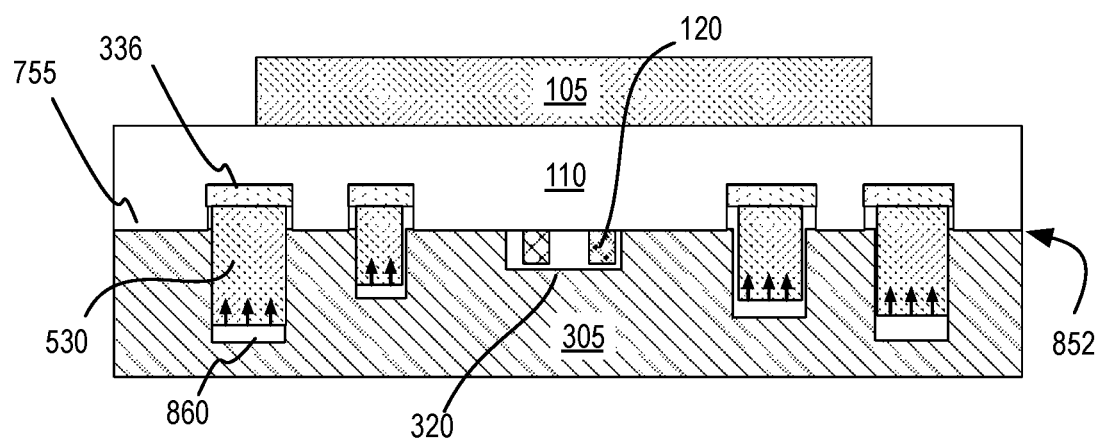
Figure 8B:
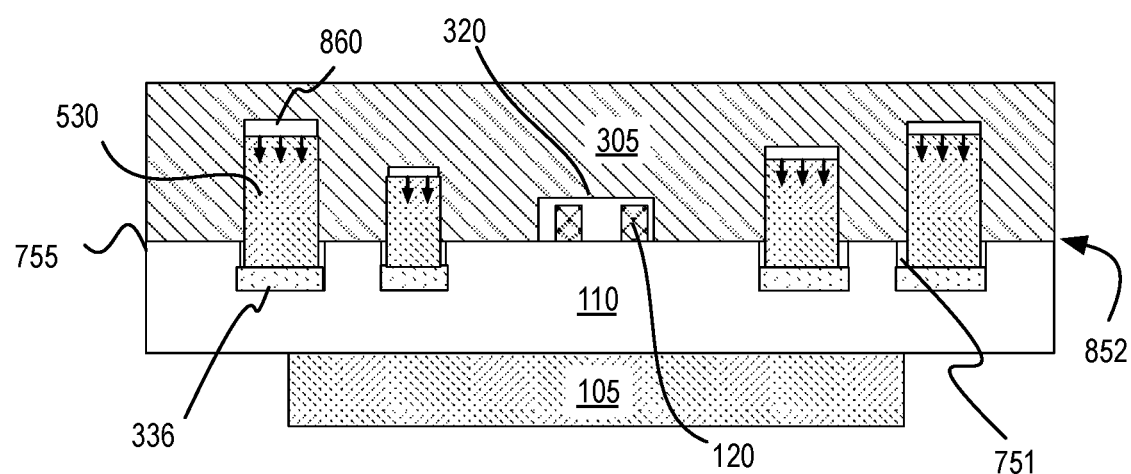

Once joined, the solder paste is transferred from the mold to lands on the package substrate. The package lands may be of any conventional surface finish that is wettable by solder. In some advantageous embodiments, the solder paste flows onto the wettable BGA land, migrating from non-wettable surfaces of the mold during an initial solder reflow process at operation 240 (FIG. 2). For package-on-mold embodiments illustrated in FIG. 8A, complete collapse is expected due to strong wetting force of BGA land 336, which is the only wettable surface exposed to each feature of solder paste 530 loaded in the mold. This wettable surface is advantageously in direct contact with solder paste 530 prior to reflow as a result of the solder paste extrusion height. During reflow, void 860 forms at the non-wettable surfaces of mold 305. For the package-on-mold embodiment illustrated in FIG. 8B, gravity may help solder paste 530 collapse onto the BGA land 336 during reflow, forming void 860 at the non-wettable surfaces of mold 305. Upon the collapse, gap space 752 is reduced to gap space 852, which may even be eliminated with a working surface of mold 305 contacting solder resist 755. Lateral gap 751 may also be reduced by flow of solder paste 530.

Figure 9A:
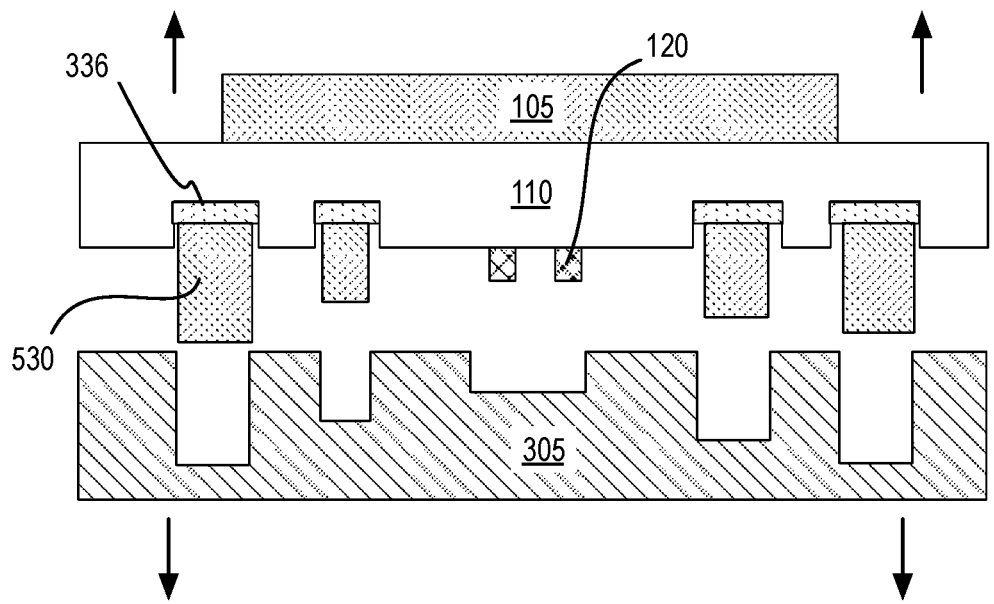
Figure 9B:
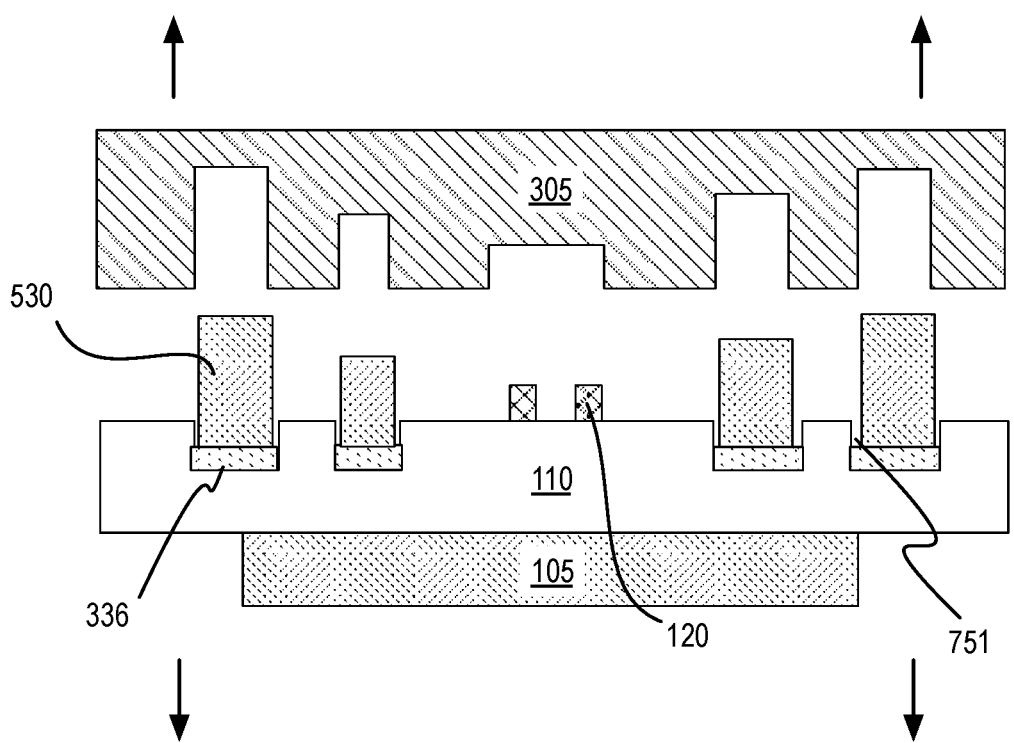

Following the initial solder paste reflow, the package can be removed from the mold. FIG. 9A, 9B depict cross-sectional views of a solder-paste loaded package separating from an emptied solder paste mold, in accordance with package-on-mold and mold-on-package embodiments, respectively. Complete transfer of solder paste 530 upon separation of the mold from the package is facilitated by the non-wettable surfaces of the mold. Following separation, mold 305 may be re-loaded for subsequent service, for example after any suitable cleaning to remove any residues that might be left by the prior paste loading.

Figure 10:
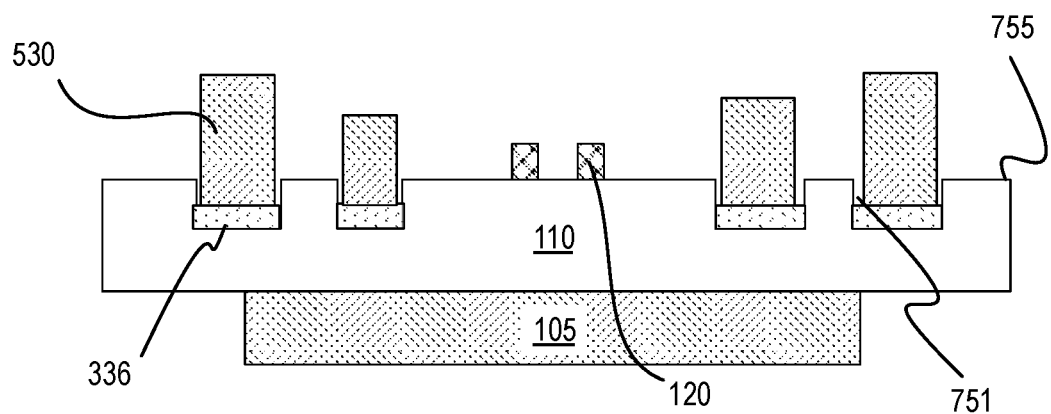

FIG. 10 depicts a cross-section view of a loaded package prior to a second reflow, in accordance with some alternative embodiments. As shown, solder paste 530 forms features of various dimensions and shapes associated with transferring from the mold cavities. Depending on the transfer process, the mold might be pushed away by strong surface tension of the molten solder and non-wettable template surface. For such embodiments, an additional reflow process subsequent to separation of the mold and package may not be needed as solder paste transfer, mold separation and solder paste reflow may all occur as a time-continuous series of events rather than discrete operations. In alternative embodiments where a secondary reflow is performed following mold separation, any known fluxless reflow process or any known flux-reflow-deflux process may be performed.

Figure 11:
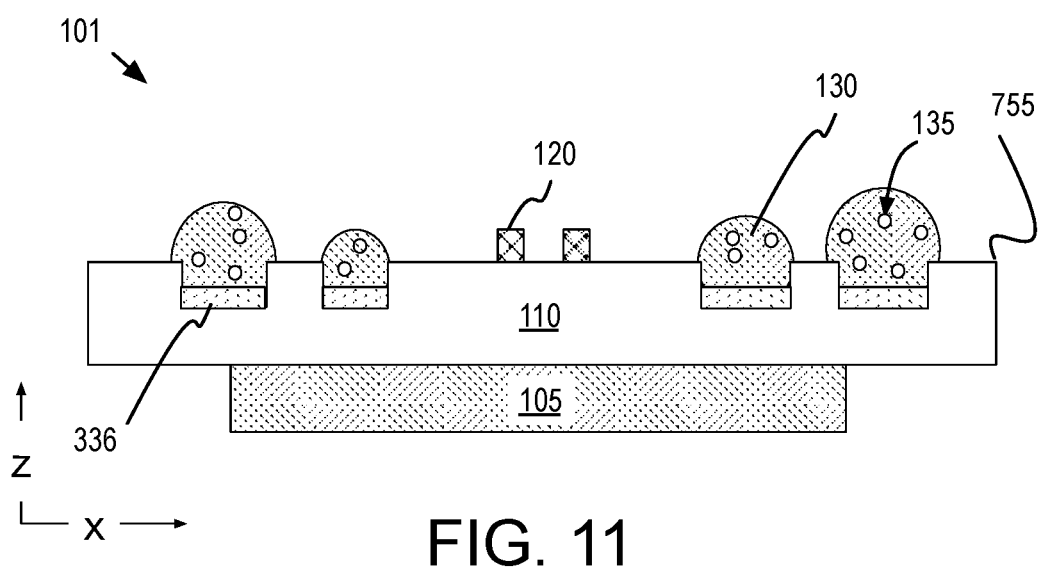

FIG. 11 depicts the BGA package 101 introduced above in the context of FIG. 1A, which may result from the reflow of molded solder paste features having free surfaces beyond openings in solder resist 755, in accordance with some embodiments. As shown, solder paste 530 has transitioned into a spherical solder feature 130. Voids 135 associated with solder paste 530 and the reflow operation(s) are present in solder feature 130. Along with varying solder feature dimensions (e.g., height), voids 135 are indicative of a molded solder paste transfer process in accordance with embodiments described above. For example, voids 135 accounting for at least 5% of the solder area are indicative of a solder feature originating from a solder paste feature.

Figure 12:
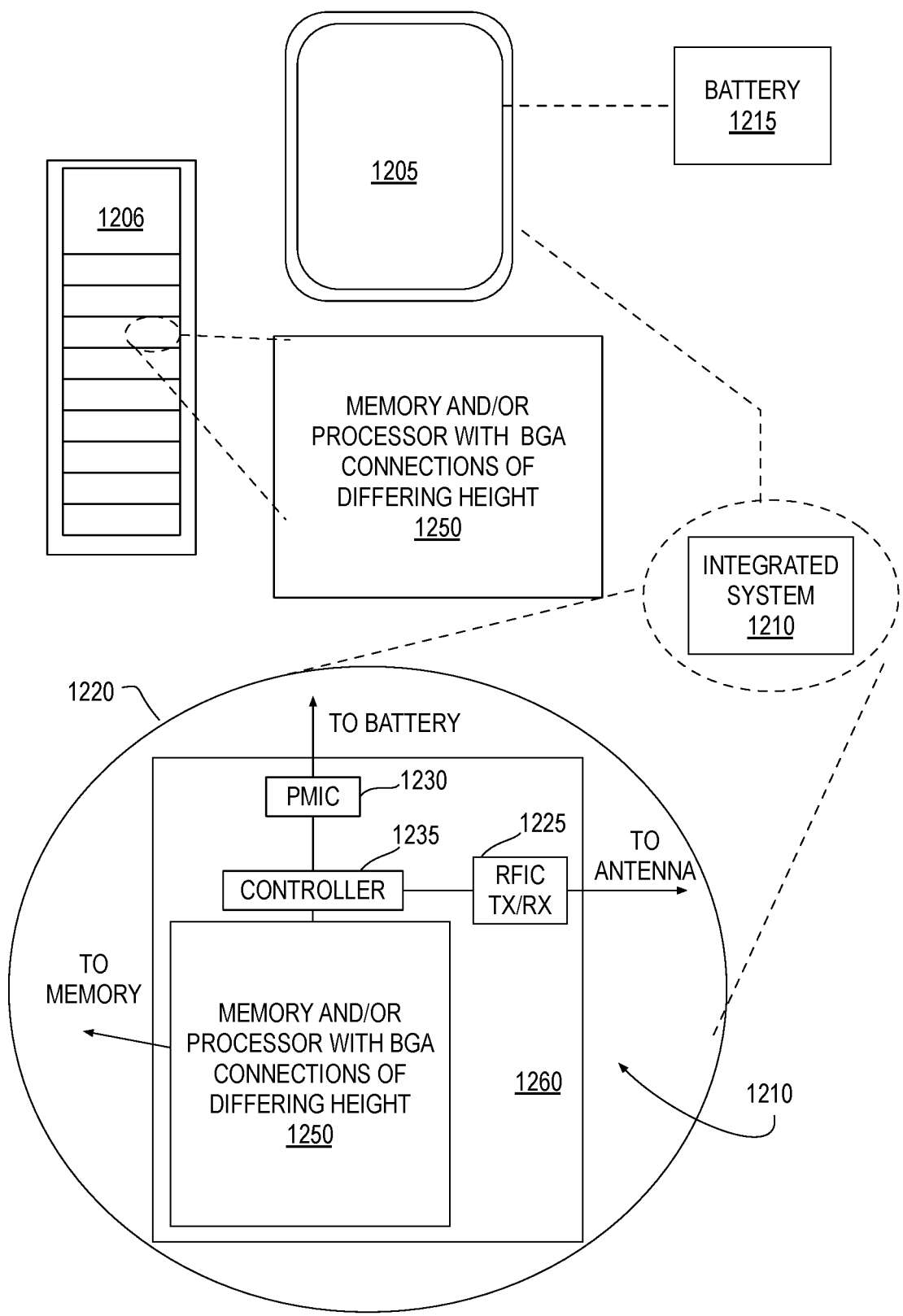

FIG. 12 illustrates a mobile computing platform and a data server machine employing a package including BGA solder connections of differing heights, for example as described elsewhere herein. The server machine 1206 may be any commercial server, for example including any number of high-performance computing platforms disposed within a rack and networked together for electronic data processing, which in the exemplary embodiment includes a packaged monolithic SoC 1250. The mobile computing platform 1205 may be any portable device configured for each of electronic data display, electronic data processing, wireless electronic data transmission, or the like. For example, the mobile computing platform 1205 may be any of a tablet, a smart phone, laptop computer, etc., and may include a display screen (e.g., a capacitive, inductive, resistive, or optical touchscreen), a chip-level or package-level integrated system 1210, and a battery 1215.

Either disposed within the integrated system 1210 illustrated in the expanded view 1220, or as a stand-alone packaged chip within the server machine 1206, monolithic SoC 1250 includes a memory block (e.g., RAM), a processor block (e.g., a microprocessor, a multi-core microprocessor, graphics processor, or the like). The packaged chip includes BGA solder connections of differing heights, for example as described elsewhere herein. The monolithic SoC 1250 may be further coupled to a board, a substrate, or an interposer 1260 along with, one or more of a power management integrated circuit (PMIC) 1230, RF (wireless) integrated circuit (RFIC) 1225 including a wideband RF (wireless) transmitter and/or receiver (TX/RX) (e.g., including a digital baseband and an analog front end module further comprises a power amplifier on a transmit path and a low noise amplifier on a receive path), and a controller 1235.

Functionally, PMIC 1230 may perform battery power regulation, DC-to-DC conversion, etc., and so has an input coupled to battery 1215 and with an output providing a current supply to other functional modules. As further illustrated, in the exemplary embodiment, RFIC 1225 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 4G, and beyond. In alternative implementations, each of these board-level modules may be integrated onto separate ICs or integrated into monolithic SoC 1250.

Figure 13:
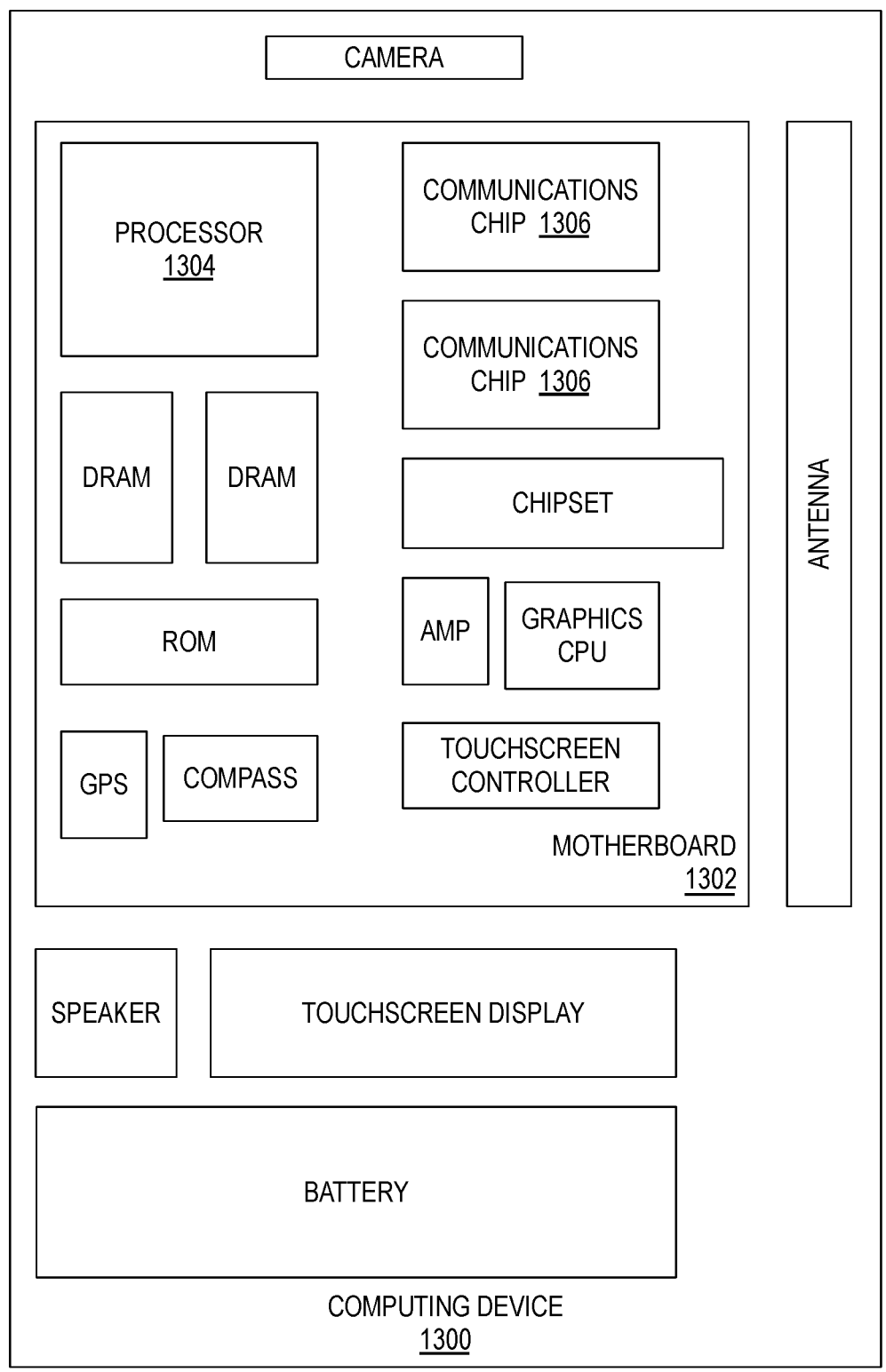

FIG. 13 is a functional block diagram of an electronic computing device, in accordance with some embodiments. Computing device 1300 may be found inside platform 1205 or server machine 1206, for example. Device 1300 further includes a motherboard 1302 hosting a number of components, such as, but not limited to, a processor 1304 (e.g., an applications processor), which may be in a package coupled to motherboard 1302 by BGA connections of differing height (volume), for example as described elsewhere herein. Processor 1304 may be physically and/or electrically coupled to motherboard 1302. In some examples, processor 1304 includes an integrated circuit die packaged within the processor 1304 and connections between the IC die and the processor 1304 are further by BGA solder connections of differing heights, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 1306 may also be physically and/or electrically coupled to the motherboard 1302. In further implementations, communication chips 1306 may be part of processor 1304. Depending on its applications, computing device 1300 may include other components that may or may not be physically and electrically coupled to motherboard 1302. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. Any of these other components may also be coupled to motherboard 1302 by BGA solder connections of differing heights, for example as described elsewhere herein.

Communication chips 1306 may enable wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1306 may implement any of a number of wireless standards or protocols, including but not limited to those described elsewhere herein. As discussed, computing device 1300 may include a plurality of communication chips 1306. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. For example the above embodiments may include specific combinations of features as further provided below.

In one or more first embodiments, a ball grid array (BGA) package includes one or more integrated circuit chips disposed within the package, and a plurality of solder features disposed over a side of the package. The solder features include a first solder feature having a first height and a second solder feature having a second height, the second height exceeding the first height by more than 10% of the first height, and wherein the first and second solder features have voids of at least 5% of the solder area.

In furtherance of the first embodiments, each of the solder features is a solder sphere. The solder spheres comprise a SnAgCu alloy. The second solder sphere is disposed more proximal a perimeter edge of the package than the first solder sphere. The first and second solder spheres have voids of at least 15% of the solder areas.

In furtherance of the first embodiments, the plurality of solder features further comprises a third solder feature having a third height, the third height exceeding the second height by more than 10% of the second height. The second solder feature is disposed more proximal a perimeter edge of the package than the first solder feature, and the third solder features is disposed more proximal the perimeter edge of the package than the second solder feature.

In furtherance of the first embodiments, a plurality of land-side components are disposed over the side of the package, the plurality of components spaced apart from the first solder feature by a first distance, and spaced apart from the second solder feature by a second distance, the second distance being greater than the first distance.

In furtherance of the first embodiments immediately above, the plurality of components are disposed within an interior portion of a land-side of the package, and surrounded by a perimeter of first solder features having no more than the first height. The first solder features are further surrounded by a perimeter of second solder features of at least the second height.

In one or more second embodiments, a method of assembling a ball grid array (BGA) package includes applying solder paste to a mold, joining the mold to a package, transferring the paste from the mold to the package, and separating the mold from the package.

In furtherance of the second embodiments, applying solder paste to the mold further comprises applying a stencil to a surface of the mold comprising one or more cavities, extruding the solder paste through one or more openings in the stencil to fill the one or more cavities, and removing the stencil from the surface of the mold.

In furtherance of the second embodiments immediately above, a lateral dimension of the openings is smaller than that of the cavities.

In furtherance of the second embodiments above, the stencil has a thickness sufficient to provide solder paste with a height that ensures, upon the joining of the mold and package, the solder paste contacts one or more BGA lands disposed on the package.

In furtherance of the second embodiments, joining the mold to the package further comprises facing a surface of the mold comprising one or more cavities filled with solder paste to a surface of the package comprising one or more BGA lands, aligning the cavities with the lands, and contacting the solder paste to the lands.

In furtherance of the second embodiments immediately above, joining the mold to the package further comprises pick-and-placing a first of the mold and package onto a second of the mold and package.

In furtherance of the second embodiments, transferring the paste from the mold to the package further comprises reflowing the solder paste sufficiently for the paste to collapse on the lands.

In furtherance of the second embodiments, the mold comprises one or more cavities having a surface that is non-wettable by solder.

In furtherance of the second embodiments immediately above, the mold comprises a first cavity having a first lateral dimension smaller than that of a solder resist opening (SRO) disposed on the package around a first BGA land that is to receive solder paste transferred from the first cavity.

In furtherance of the second embodiments immediately above, the mold comprises a second cavity, the second cavity having a depth that is greater than that of the first cavity, and, after separating the substrate from the mold, solder paste transferred to a first BGA land from the first cavity has a first height less than that of solder paste transferred to a second BGA land from the second cavity.

In one or more third embodiments, a solder paste mold includes a grid array of first cavities having a pitch no more than 600 μm to be aligned with BGA lands disposed on a package, wherein the first cavities include a cavity of a first depth and a cavity of a second depth, greater than the first depth. The mold includes a second cavity to be aligned with a land-side components disposed on the package substrate, wherein at least the first cavities comprise surfaces non-wettable by solder.

In furtherance of the third embodiments, the first cavities have a lateral diameter no more than 250 μm, and the first depth is less than twice the lateral diameter.

In furtherance of the third embodiments, at least the non-wettable surfaces comprise graphite.

In furtherance of the third embodiments immediately above, the mold is a unitary body of graphite.

In furtherance of the third embodiments, the mold comprises a stainless steel bulk coated with a material that is non-wettable by solder.

However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A method of assembling a ball grid array (BGA) package, the method comprising:
    applying a stencil over a surface of a mold, the mold comprising a first cavity having a first depth and a second cavity having a second depth, greater than the first depth;
    loading the first mold cavity with a first volume of solder paste, and loading the second mold cavity with a second volume of solder paste, larger than the first volume, by applying solder paste through openings in the stencil;
    exposing a surface of the solder paste volumes by removing the stencil from the surface of the mold;
    joining the mold to a package substrate with the first volume of solder paste contacting a first BGA land and the second volume of solder paste contacting a second BGA land, wherein the second BGA land is located more proximal to a perimeter of the package substrate than the first BGA land;
    transferring the paste from the mold to the package substrate by reflowing the solder paste sufficiently for the paste to migrate from the cavities; and
    separating the mold from the package substrate.

2. The method of claim 1, wherein a lateral dimension of the stencil openings is smaller than that of the cavities.

3. The method of claim 1, wherein joining the mold to the package substrate further comprises:
    facing a surface of the mold comprising one or more cavities filled with solder paste to a surface of the package substrate comprising one or more BGA lands;
    aligning the cavities with the lands; and
    contacting the solder paste to the lands.

4. The method of claim 3, wherein joining the mold to the package substrate further comprises pick-and-placing a first of the mold and package onto a second of the mold and package.

5. The method of claim 1, wherein the mold comprises one or more cavities having a surface that is non-wettable by solder.

6. The method of claim 1, wherein the first cavity has a first lateral dimension smaller than that of a solder resist opening (SRO) disposed on the package substrate around the first BGA land.

7. The method of claim 6, wherein:
the second cavity is in a region of the mold corresponding to a BGA land position more proximal to a perimeter edge of the package substrate than the first cavity; and
after separating the substrate from the mold, solder paste transferred to the first BGA land from the first cavity has a first height less than that of solder paste transferred to the second BGA land from the second cavity.

8. The method of claim 1, wherein:
applying the stencil further comprises masking at least one of the mold cavities with the stencil; and
joining the mold to the package substrate further comprises aligning one of the mold cavities that was masked by the stencil with a land-side component on the package substrate.

9. The method of claim 1, further comprising performing a solder paste reflow subsequent to removing the mold to form solder features in contact with the lands.

10. The method of claim 9, wherein the solder features comprise a SnAgCu alloy.

11. The method of claim 10, wherein the first and second solder features have voids of at least 15% of the solder area.

12. The method of claim 10, wherein the solder features comprise first solder feature having a first height and a second solder feature having a second height, the second height exceeding the first height by more than 10% of the first height and wherein the second solder feature is more proximal to a perimeter edge of the package than the first solder feature.

13. The method of claim 1, wherein the mold comprises a grid array of cavities having a pitch no more than 600 μm.

14. The method of claim 13, wherein the cavities have a lateral diameter no more than 250 μm.

15. The method of claim 1, wherein the mold comprises at least one of liquid crystal polymer or graphite.

16. The method of claim 1, wherein the mold comprises a stainless steel body coated with a material that is non-wettable by solder.

* * * * *